United States Patent [19]

Deppe et al.

[11] Patent Number: 6,075,804
[45] Date of Patent: Jun. 13, 2000

[54] SEMICONDUCTOR DEVICE HAVING AN OXIDE DEFINED APERTURE

[75] Inventors: Dennis G. Deppe, Austin, Tex.; Jack L. Jewell, Boulder, Colo.

[73] Assignee: Picolight Incorporated, Boulder, Colo.

[21] Appl. No.: 09/015,059

[22] Filed: Jan. 28, 1998

[51] Int. Cl.[7] .............................. H01S 3/19; H01S 3/08
[52] U.S. Cl. .............................................. 372/96; 372/46
[58] Field of Search .................................. 372/45, 46, 96; 257/94, 96, 98

[56] References Cited

U.S. PATENT DOCUMENTS

| | | | |
|---|---|---|---|
| 5,262,360 | 11/1993 | Holonyak | 438/767 |
| 5,373,522 | 12/1994 | Holonyak et al. | 372/45 |
| 5,493,577 | 2/1996 | Choquette et al. | 372/46 |
| 5,881,085 | 3/1999 | Jewell | 372/46 |
| 5,886,370 | 3/1999 | Sun et al. | 372/46 |
| 5,915,165 | 6/1999 | Sun et al. | 438/47 |

OTHER PUBLICATIONS

Choquette, et al., "Low threshold Voltage Vertical–Cavity Lasers Fabricated by Selective Oxidation," Electronics Letters, pp. 2043–2044, vol. 30, No. 24, Nov. 1994.

Choquette, et al., "Fabrication and Performance of Selectively Oxidized Vertical–Cavity Lasers," IEEE Photonics Technology Letters, vol. 7, No. 11, pp. 1237–1239, (Nov., 1995).

Dallasasse, et al., "Hydrolyzation Oxidation of $Al_xGa_{1-x}As–AlAs–GaAs$ Quantum Well Heterostructures and Superlattices," Applied Physics Letters, vol. 57, No. 26 pp. 2844–2846, Dec. 1990.

Babic, et al., "Room–Temperature Continuous–Wave Operation of 1.54–$\mu$m Vertical–Cavity Lasers," IEEE Photonics Technology Letters, vol. 7, No. 11 pp. 1225–1227 (Nov., 1995).

Blum, et al., "Electrical and Optical Characteristics of AlAsSb/GaAsSb Distributed Bragg Reflectors for Surface Emitting Lasers," Applied Physics Letters, vol. 67, No. 22 pp. 3233–3235 (Nov. 1995).

Ochiai, et al., "Kinetics of Thermal Oxidation of AlAs in Water Vapor," Applied Physics Letters, vol. 68, No. 14 pp. 1898–1900, Apr., 1996.

Chang–Hasnain, et al., "Low Threshold Buried Heterostructure Vertical Cavity Surface Emitting Laser," Applied Physics Letters, vol. 63, No. 10 pp. 1307–1309 (Sep. 1993).

*Primary Examiner*—Teresa M. Arroyo
*Assistant Examiner*—Quyen P. Leung
*Attorney, Agent, or Firm*—Jagtiani & Associates

[57] ABSTRACT

An improved aperture is provided. The aperture comprises: at least a first layer; the first layer being oxidized in a laterally oriented first region; the first layer being modified within a laterally oriented second region, the second region being oxidized less than the first region; a second layer disposed above the first layer, the second layer being oxidized less than the first layer and providing material to modify the laterally oriented second region and thereby define an aperture. Additionally, a method for producing the aperture is disclosed.

18 Claims, 3 Drawing Sheets

SEMICONDUCTOR DEVICE HAVING AN OXIDE DEFINED APERTURE

CROSS-REFERENCE TO RELATED APPLICATIONS

This application makes reference to the following co-pending U.S. Patent Applications. The first application is now U.S. Pat. No. 5,719,891 entitled "Conductive Element with Lateral Oxidation Barrier," filed Dec. 18, 1995. The second application is now U.S. Pat. No. 5,729,566 entitled "Light Emitting Device Having an Electrical Contact Through a Layer containing Oxidized Material," filed Jun. 7, 1996. The third application is now U.S. Pat. No. 5,881,085 entitled "Lens Comprising at Least One Oxidized Layer and Method for Forming Same," filed Jul. 25, 1996. The fourth application is now U.S. Pat. No. 5,724,374 entitled "Aperture comprising an Oxidized Region and a Semiconductor Material," filed Aug. 19, 1996. The fifth application is now U.S. Pat. No. 5,719,895 entitled "Extended Wavelength Strained Layer Lasers Having Short Period Superlattices," filed Sep. 25, 1996. The sixth application is now U.S. Pat. No. 5,825,796 entitled "Extended Wavelength Strained Layer Lasers Having Strain Compensated Layers," filed Sep. 25, 1996. The seventh application is now U.S. Pat. No. 5,719,894 entitled "Extended Wavelength Strained Layer Lasers Having Nitrogen Disposed Therein," filed Sep. 25, 1996. The eighth application is now U.S. Pat. No. 5,859,864 entitled "Extended Wavelength Strained Layer Lasers Having a Restricted Growth Surface and Graded Lattice Mismatch," filed Oct. 28, 1996. The ninth application is now U.S. Pat. No. 5,822,356 entitled "Intra-Cavity Lens Structures for Semiconductor Lasers," filed Feb. 6, 1997. The tenth application is now U.S. Pat. No. 5,897,329 entitled "Method for Producing an Electrically Conductive Element," filed Nov. 5, 1997. The eleventh application is now U.S. Pat. No. 5,903,589 entitled "Oxidizable Device Having Cavities which Allow for Improved Oxidation of the Semiconductor Device," filed Dec. 8, 1997. These applications are hereby incorporated by reference.

BACKGROUND OF THE INVENTION

1. Field of the Invention

The present invention relates generally to light emitting devices, and more particularly to an improved vertical cavity light emitting device having an improved intra-cavity aperture structure formed by selective oxidation in which the extent of the selective oxidation is controlled by impurity induced intermixing.

2. Description of the Prior Art

Vertical-Cavity Surface-Emitting Lasers (VCSELs), Surface Emitting Lasers (SELs) or Light Emitting Diodes (LEDs) are becoming increasingly important for a wide variety of applications including optical interconnection of integrated circuits, optical computing systems, optical recording and readout systems, and telecommunications. Vertically emitting devices have many advantages over edge-emitting devices, including the possibility for wafer scale fabrication and testing, and the possibility of forming two-dimensional arrays of the vertically emitting devices. The circular nature of the light output beams from these devices also make them ideally suited for coupling into optical fibers as in optical interconnects or other optical systems for integrated circuits and other applications.

VCSELs whose current flow is controlled by lateral oxidation processes show the best performances of any VCSELs in terms of low threshold current and high efficiency. In oxidized VCSELs the oxidation occurs in the lateral direction from the sides of etched mesas in the VCSEL wafers, typically under the conditions of 425° C. temperature with high water-vapor content. VCSELs or any other vertical light emitting devices employing laterally oxidized layers have been typically limited to structures that have been grown upon gallium arsenide (GaAs) substrates. For further details, see U.S. Pat. No. 5,493,577, by Choquette et al.

Another advantageous feature is to have one or both mirrors in which some of the layers are laterally oxidized layers. Such mirrors achieve very high reflectivities with a relatively small number of layers compared to all-semiconductor mirrors. For example, a 99.95% reflecting bottom mirror may be grown with 5 to 7 periods instead of the more usual 25 to 30 periods. Such mirrors have desirable features over the all-semiconductor mirrors, especially for longer wavelengths, such as wavelengths greater than 1.2 $\mu$m.

Since VCSELs are presently the subject of intense research and development, a great deal of results and advancements are published monthly. The following is a summary of the prior art documents which are most relevant to the problem of forming oxide apertures or regions.

Most reports of the oxidation process describe oxidation in layers of aluminum arsenide (AlAs) or aluminum gallium arsenide ($Al_xGa_{1-x}As$) where the Al concentration, x, is close to unity. As reported by Choquette, et al. in "Low threshold Voltage Vertical-Cavity Lasers Fabricated by Selective Oxidation," which appeared in Electronics Letters, volume 24, pp. 2043–2044, 1994, reducing the Al concentration from x=1.0 to x=0.96 reduces the oxidation rate by more than one order of magnitude. At x=0.87, the oxidation rate is reduced by two orders of magnitude compared to x=1.0. Due to the extreme sensitivity of the oxidation rate to the Al concentration and the fact that Al concentration may vary from wafer to wafer or even over the area of a single wafer, the manufacturability of oxidized VCSELs has been questioned. In the publication by Choquette et al., entitled "Fabrication and Performance of Selectively Oxidized Vertical-Cavity Lasers," which appeared in IEEE Photonics Technology Letters, vol. 7, pp. 1237–1239, (November, 1995), this problem was noted followed by the observation that "Therefore, stringent compositional control may be necessary for wafer scale manufacture of uniformly sized oxide apertures."

A limited form of lateral control of oxidation is reported in the publication by Dallesasse, et al. entitled "Hydrolyzation Oxidation of $Al_xGa_{1-x}As$-AlAs-GaAs Quantum Well Heterostructures and Superlattices," which appeared in Applied Physics Letters, volume 57, pp. 2844–2846, 1990. The same work is also described in U.S. Pat. No. 's 5,262,360 and 5,373,522, both by Holonyak and Dallesasse. In that work, GaAs-AlAs superlattices were interdiffused in selected regions by impurity-induced layer disordering (IILD). The interdiffusion was essentially complete in the selected regions, thus the interdiffused regions comprised an AlGaAs compound having an Al concentration being approximately uniform and equal to the average Al concentration of the original constituent AlAs and GaAs layers. The oxidation proceeded through the superlattice regions but not significantly into the interdiffused regions. The superlattice was not doped and contained no other structure from which to fabricate any electronic or optoelectronic device. No attempt was made to form any kind of conductive aperture or boundary or to limit the vertical extent to which the interdiffusion occured.

The oxidation rate of materials such as AlGaAs is a sensitive function of the Al concentration as described by Choquette et al. in Electronics Letters 30, pp. 2043–2044 (1994). It is therefore possible to control the extent of oxidation for multiple layers in a single process by having the layers be of different material compositions. It has also been found however, that the precise composition of a pre-oxidized layer may have a profound Iti effect on the reliability of the oxidized structure. For example, oxidized $Al_{0.98}Ga_{0.02}As$ layers appear to be much more reliable than oxidized AlAs layers. Thus, it is preferred that all oxidizable layers in the structure have nominally the same material composition.

A thorough discussion on how the oxidation rate varies with temperature is described by Ochiai et al. in Applied Physics Letters, vol. 68, pp. 1898–1900 (1996). The authors show that for low oxidation temperatures and small oxidation depths, the oxidation depth varies linearly with time. For higher oxidation temperatures and/or large oxidation depths, the depth varies as the square root of time.

SUMMARY OF THE INVENTION

It is therefore an object of the invention to provide an improved oxide-formed aperture which is manufacturable.

It is another object of the invention to provide an improved oxide-formed aperture which is reliable.

It is another object of the invention to provide an improved oxide-formed aperture in which the extent of the oxidation is controlled and defined by photolithography.

It is another object of the invention to provide a light emitting diode which utilizes the oxide-formed aperture.

It is another object of the invention to provide a vertical-cavity surface-emitting laser which utilizes the oxide-formed aperture.

According to one broad aspect of the present invention, there is provided a semiconductor device having an oxide defined aperture, the aperture comprising: a at least a first oxidizable layer, the first oxidizable layer being modified by the addition of oxidation inhibiting elements within a laterally oriented first region forming a lateral oxidation barrier, and a second region which is oxidizable; a substrate disposed below the first oxidizable layer; and a nonoxidizable second layer disposed above the first oxidizable layer, the nonoxidizable second layer for providing the oxidation inhibiting elements to the first region, and the nonoxidizable second layer being present over at least a portion of the first region and being substantially removed over a laterally oriented third region.

According to another broad aspect of the invention, there is provided a method for fabricating a semiconductor device having an oxide defined aperture comprising the steps of:. growing a first oxidizable semiconductor layer having at least an initial Al content greater than 20%; growing a top semiconductor layer containing oxidation inhibiting elements selected from the group consisting of: Ga, In and P, the top semiconductor layer also containing an element which promotes intermixing of the top semiconductor layer with the oxidizable layer; removing portions of the top semiconductor layer and leaving portions of the top semiconductor layer in at least one laterally defined area; growing a covering layer over the top semiconductor layer; intermixing the top semiconductor layer with the first oxidizable layer in the laterally defined areas so as to introduce oxidation inhibiting elements into select regions of the first oxidizable layer and thereby form a intermixed region in the first oxidizable layer; and exposing the semiconductor layers and oxidizing the first oxidizable layer outside of the intermixed region.

Other objects and features of the present invention will be apparent from the following detailed description of the preferred embodiment.

BRIEF DESCRIPTION OF THE DRAWINGS

The invention will be described in conjunction with the accompanying drawings, in which.

DETAILED DESCRIPTION OF THE PREFERRED EMBODIMENT

Figure 1:
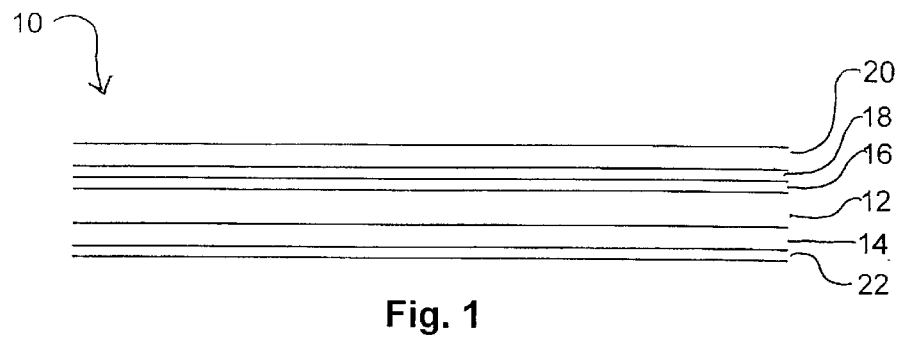
FIGS. 1 through 5 are cross sections of the construction of an oxide-formed aperture, which is constructed in accordance with a preferred embodiment of the invention.

With reference to the Figures, wherein like reference characters indicate like elements throughout the several views and, in particular, with reference to FIG. 1, a cross section of a lens or aperture 10 is illustrated which has an initially oxidizable layers 12 and 14 as well as non-oxidizable layers 16, 18 and 20. The various layers are preferably semiconductor layers comprising group-III and group-V elements, for example: AlP, AlAsP, AlGaAs, AlGaAsP, AlAs, AlAsP, AlPSb, AlGaPSb, InAlAs, InAlGaAs, InAlGaAsP, AlAsSb, AlAsSbP, AlGaAsSb, InGaAlAsSbP, AlSb, AlPSb, AlGaP or InAlGaAsSb, or any combination thereof for the initially oxidizable layers 12 and 14, and GaAs, AlGaAs, InAlGaAs, InAlGaP, GaAsSb, GaPSb, AlGaPSb, InGaAs, or InGaAsP, AlPSb, AlGaP, InAlGaAsSb, InGaP, or InP or any combination thereof for the non-oxidizable layers 16, 18 and 20.

The term oxidizable and oxidized are used consistently throughout the application and it should be appreciated that at least extensive parts of the initially oxidizable layers are oxidized during fabrication and thus produce oxidized material, regions, portions or layers. By an initially oxidizable material or layer, applicant means any group III–V material with sufficient aluminum (Al) content which may be oxidized significantly under the process for manufacturing lens or aperture 10. For example, the initial Al content may be greater than 20% of the group III material. By an oxidized semiconductor material or layer, applicant means any region of an Al bearing III–V material where oxygen has replaced the group V material in a proportion being greater than or equal to 90%.

It should be appreciated that any material, including material referred to as "non-oxidizable," may be oxidized, given a sufficiently high oxidation temperature and/or long enough time, especially if the oxidation is not extensive. Therefore, applicant means that layers 16, 18 and 20 resists oxidation to a great extent. This may be accomplished by the semiconductor material having a sufficient amount of oxidation inhibiting elements such as, but not limited to: Ga, In or P. By a non-oxidized semiconductor material, applicant means any III–V material where the oxygen has replaced the group V material in a proportion being less than or equal to 10%. The terms non-oxidizable and non-oxidized are used consistently throughout the application and it should be appreciated that the non-oxidizable materials are not extensively oxidized during the fabrication conditions and thud produce non-oxidized materials. For example, given a semiconductor material, AlGaAs, with the group III component having about 15% Ga and 85% Al, the resulting non-oxidized material would oxidize about two orders of magnitude more slowly than AlAs. Under appropriate conditions for oxidizing AlAs, such AlGaAs will therefore not oxidize extensively. Thus, the terms "oxidizable" and "non-oxidizable" are relative. For the oxidation processes used in the preferred embodiments, it is preferable to maintain at least two times the oxidation rate between the oxidizable and non-oxidizable semiconductor materials. Finally, it is to be appreciated that limited portions of non-oxidizable material may become oxidized. For example, the outer side walls of the non-oxidizable material may become oxidized.

Turning now to FIG. 1, the first step in the fabrication process for constricting lens or aperture 10 is illustrated. As may be seen, initially oxidizable layers 12 and 14 are disposed adjacent to each other. The main differences between layers 12 and 14 are the concentration of Al in the layers and the thickness of the layers. In a preferred embodiment, layer 12 will have x~1, i.e., the layer will be substantially AlAs. Additionally, layer 12 will have a thickness of ~200 Å. It should be appreciated that layer 12 may have x be between 0.5 and 1.0 as well as have a thickness between 5 Å and 2,000 Å and be within the scope of the invention.

In a similar fashion, layer 14 will have x~0.9, i.e., the layer will be substantially $Al_{0.9}Ga_{0.1}As$. Additionally, layer 14 will have a thickness of ~300 Å. It should be appreciated that layer 14 may have x be between 0.0 and 0.99 as well as have a thickness between 5 Å and 10,000 Å and be within the scope of the invention. By providing for two distinct layers 12 and 14, one is able to achieve good reproducibility in oxidation, and to minimize the intermixing and oxidation temperatures and times. In this manner, the oxidizing process in layer 12 extends vertically into layer 14. It should be appreciated that controlling the thickness of layers 12 and 14 may precisely control aperture 10 thickness. In a preferred embodiment, layers 12 and 14 are doped with an n-type material such as Si at concentration levels ranging from $~1 \times 10^{18}$ cm$^{-3}$ to $~3 \times 10^{18}$ cm$^{-3}$. In an alternative embodiment, layer 14 may have a continuously or stepwise graded Al concentration.

In an alternative embodiment, layers 12 and 14 would be combined into a single layer where x is between 0.5 and 0.99. Additionally, the thickness of this single layer would be between 40 Å and 3,000 Å. For clarity, this single layer is not illustrated but may be created by removing the boundary line between layers 12 and 14. For a detailed discussion of a single oxidizable layer, the reader is referred to U.S. Pat. No. 5,719,891, entitled "Conductive Element with Lateral Oxidation Barrier," filed Dec. 18, 1995. This application is hereby incorporated by reference.

Next, at least one non-oxidizable layer such as layer 20 would be grown on layer 12. In a preferred embodiment, layer 20 would be used as the source for providing intermixing material to layer 12. Therefore, this layer should be GaAs or any other highly non-oxidizable material. Finally, this layer should be thin, e.g, ~200 Å, and preferably is between 10 Å and 1,000 Å thick. As may be seen, layer 20 may have a dopant such as Si at concentration levels ranging from $~5 \times 10^{17}$ cm$^{-3}$ to over $~9 \times 10^{19}$ cm$^{-3}$. This range is critical in that the concentration of the dopant is chosen to be at least $5 \times 10^{17}$ cm$^{-3}$ higher than the average dopant concentration in layer 12. Preferably, the dopant is a n++ type dopant.

Layers 16 and 18 are provided as examples of layers that may be placed between layers 12 and 20. Layers 16 and 18 are preferably doped with the same type of material as layer 12. As illustrated in FIG. 1, layer 16 is a GaAs layer having a thickness of ~50 Å while layer 18 is a $Al_xGa_{(1-x)}As$ layer having a thickness of ~50 Å. In a preferred embodiment, x in layer 18 would vary between 0.7 and 1.0. In this embodiment, layer 16 functions as a barrier layer and layer 18 functions as an additional source for providing intermixed material to layer 12. In one embodiment, layer 16 may be substantially identical to layer 14. In this case, if layer 14 has a graded Al composition, layer 16 may have a similar graded composition, but inverted, for example, with both layers 14 and 16 graded to lower Al concentrations away from layer 12.

In an alternate embodiment, the process is performed with a p-type dopant selected from the group consisting of: Be, Zn and Mg. In a preferred embodiment, it is more desirable to use an n-type design and a column IV dopant such as Si to achieve the layer intermixing or disordering as described below. The above descriptions for layers 12 through 20 have provided an example of an n-type design. It should be appreciated that the particular dopant and concentration is quite important since this dopant is used to carry out the intermixing or disordering of the layers as described below. Finally, there may be any number of layers disposed between layer 14 and substrate 22.

Figure 2:
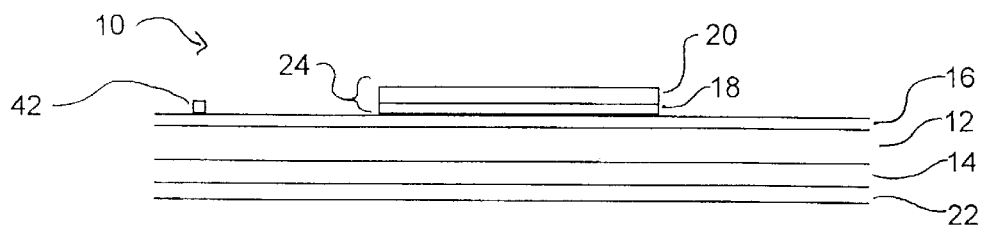

Turning now to FIG. 2, the next step of the process is illustrated. As may be seen, a very shallow mesa 24 is formed, for example, by using selective etches such as peroxide and ammonium hydroxide for GaAs layer 20 and (diluted) HCl or HF for $Al_xGa_{(1-x)}As$ layer 18. It should be appreciated that mesa 24 may be formed via a wet chemical etch or by dry etching such as plasma etching, ion milling, reactive ion etching, chemically assisted ion beam etching, electron cyclotron etching, or any other material removal process known in the etching art.

It should be appreciated that this etching step may be replaced by an implantation or a shallow diffusion. Both of these alternative steps are described in detail below.

In an implantation process embodiment, a mask, for example photoresist, blocks the bombardment of ions except in preselected regions. In this embodiment, photoresist would be placed over the region which forms mesa 24. The result is a distribution of implanted ions which is most dense away from the center and gradually becomes less dense above, below and to either side of the center. In the preferred version of this alternative embodiment, the ions or dopant used will be a dopant of the opposite type used in layer 20. An example of such a dopant is a p type dopant such as Be if the dopant in layer 20 is an n type dopant such as Si. In a similar fashion, if layer 20 is a p type material, the dopant for the process would be an n type dopant such as Si. Preferably, the concentration of the implanted dopant would be approximately equal to that of the dopant in layer 20. The effect of the implanted dopant is to prevent intermixing of material in layer 20 to layer 12 in select regions where the p type dopant is present. In this fashion, intermixed region 30 may be created without the need for etching of mesa 24.

In the shallow diffusion embodiment, a shallow diffusion of a dopant of opposite type to that of layer 20 would be introduced in a similar fashion to the reverse process. But, in this embodiment, the dopant would be diffused into layer 20 by a diffusion process instead of ion implantation as described above.

Figure 3:
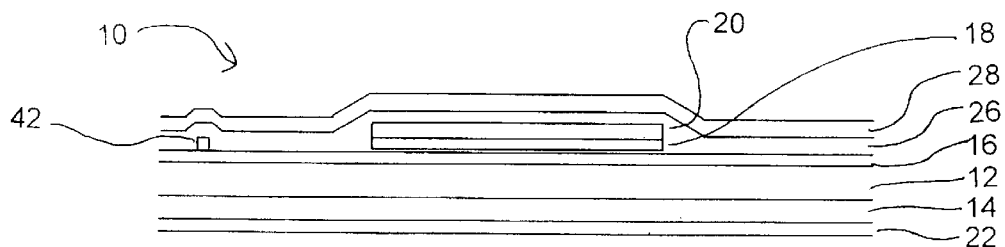

Turning now to FIG. 3, the process of constructing a semiconductor device is continued. In particular, this Figure illustrates the formation of a DBR mirror pair. It should be appreciated that any structure may be grown at this stage and that the growth of the DBR pair is illustrative of growing one of an infinite number of different structures. Assuming that it is desired to grow a DBR, layers 26 and 28 are grown by epitaxial regrowth. The epitaxial regrowth may preferably be accomplished by organo-metallic vapor phase epitaxy (OMVPE), for example at a temperature of greater than 700° C., and may take on the order of 1–2 hours. In a preferred embodiment, layer 26 comprises $Al_xGa_{(1-x)}As$ where x is ~0.15 and is doped with an n-type dopant. Similarly, layer 28 comprises $Al_xGa_{(1-x)}As$ where x is ~0.9 and is doped with an n-type dopant.

Figure 4:
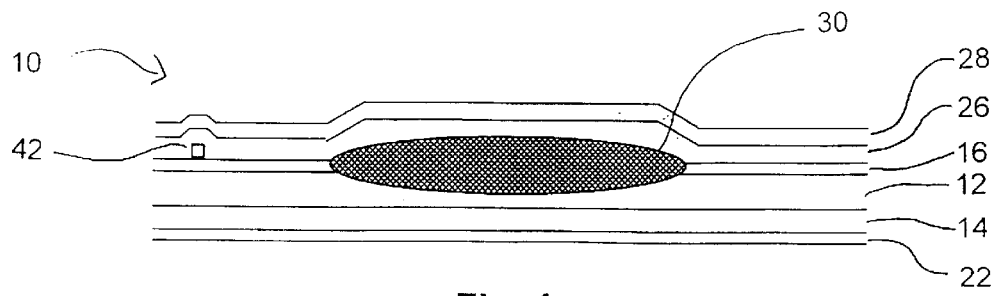

FIG. 4 illustrates an annealing step that creates an intermixed region 30. The intermixing of region 30 introduces non-Al elements into oxidizable layer 12, rendering selective portions, i.e., intermixed region 30, resistive to oxidation as compared to layers 12 and 14. Thus, intermixed region 30 forms an oxidation barrier in at least layer 12. In a preferred embodiment, region 30 is substantially electrically conductive, while the oxidizable portion of layer 12 is electrically resistive. It should be appreciated that the inventive process is not restricted to the formation of current apertures, but may be used to form any type of aperture. The intermixing of oxidizable layer 12 and nonoxidizable layer 20 occurs preferentially in intermixed region 30 due to the presence of high doping concentrations in the portion of layer 20 that remains after etching.

Figure 5:
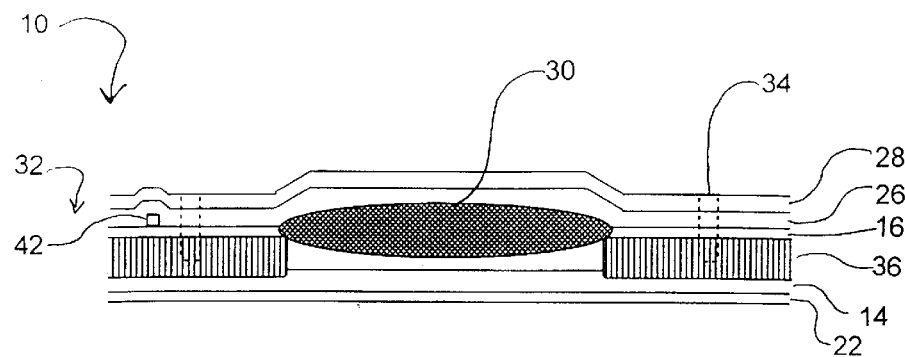

Turning now to FIG. 5, the final oxidized aperture 10 is illustrated. In this step, oxidation is performed as described in the art, for example at 425° C. in a water vapor rich atmosphere for 1–4 hours. Layer 12 is oxidized by being exposed to the water vapor via a trench 32 or at least one cavity 34 and thereby forming an oxidized region 36. As may be seen in FIG. 6, oxidized region 36 has a toroidal or doughnut shape when viewed from the top. Preferably, oxidized region 36 surrounds intermixed region 30 in a lateral plane. Layer 14 is illustrated as being partially oxidized. This is accomplished by the fact that layer 14 adjoins layer 12 and is vertically oxidized from layer 12. As discussed above, layers 12 and 14 may be combined or layer 14 may not be present. Additionally, it should be appreciated that while layer 14 is illustrated as being only partially oxidized in a vertical direction, it may be fully oxidized vertically, but not fully oxidized in a lateral direction.

As discussed above, a trench 32 may be utilized to provide access to layer 12. This method is not the preferred method since it involves another etching step. Preferably, a cavity 34 is used. Cavities 34 have significant advantages over trenches as discussed in detail in U.S Pat. No. 5,903,589 entitled "Oxidizable Device Having Cavities which Allow for Improved Oxidation of the Semiconductor Device," filed Dec. 8, 1997. This application is hereby incorporated by reference.

An alignment feature 42 is illustrated in FIGS. 2 through 5. This alignment feature is illustrated as a bump. It should be appreciated that this alignment feature may be a recess or any other feature known in the semiconductor alignment art. Alignment feature 42 is important in that when successive layers such as layers 26 and 28 are grown, the location of intermixed region 30 may be determined. This is due to the extreme accuracy provided by photolighography. Thus, by knowing the location of alignment feature 42, one may determine the location of region 30 that forms an oxide aperture as described above and illustrated in FIG. 6.

It should be appreciated that when regrowth steps such as that illustrated in FIG. 3 are performed it is advantageous to use materials which do not readily oxidize in air. Thus, it is preferable for layer 20 and possibly layers 16 and 26 to comprise materials not containing substantial concentrations of Al, i.e., less than 10%. Examples of desirable materials include: GaAs and InGaP. In some embodiments, for example, use of GaAs in an 850 nm emitting VCSEL, the nominal concentration of these layers may absorb light at the emission wavelength. To avoid this problem, such layers should be doped appropriately and be surrounded by higher bandgap material, AlGaAs with greater than 10% Al and with a doping concentration $~2\times10^{17}cm^{-3}$. When the annealing step, illustrated in FIG. 4, occurs the materials which are intermixed into layer 20 and in region 30 should be sufficient to render that portion of layers 20, 16 and 26 to be nonabsorbing at the emission wavelength.

Figure 6:
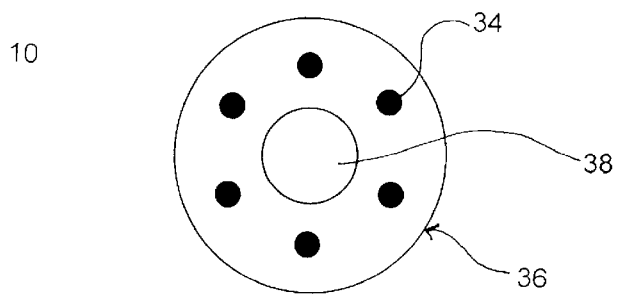
FIG. 6 is a top view of an oxide-formed aperture illustrated in FIG. 5.

Turning now to FIG. 6, a top view of aperture 10 is illustrated. As may be seen aperture 10 has an oxidized region 36 that is accessed via cavities 34. A non-oxidized central region 38 is surrounded in a lateral plane by oxidized region 36.

Figure 7:
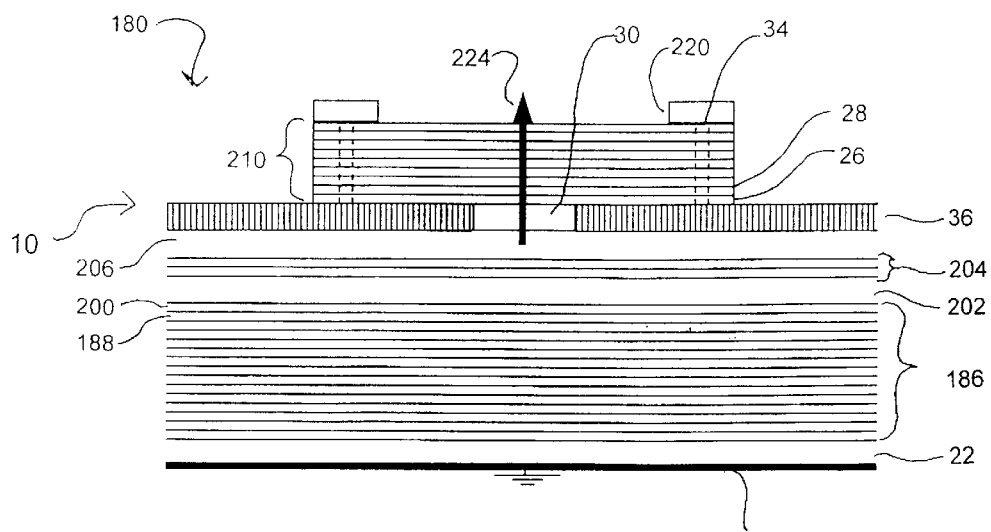
FIG. 7 is a cross section a VCSEL utilizing an aperture from FIGS. 5 and 6.

Turning now to FIG. 7, there is shown light emitting device 180 that comprises lens and/or aperture 10. In a preferred embodiment, aperture 10 serves the dual function of electrical current aperture and optical intracavity lens. Light emitting device 180 is preferably a vertical cavity surface emitting laser (VCSEL), but it may also be a resonantcavity light emitting diode (RCLED) or a laser diode. Device 180 may be grown on substrate 22. Bottom mirror 186 comprises high-index layers 188 and low-index layers 200. On bottom mirror 186 is grown bottom spacer 202, active region 204, top spacer 206, and the semiconductor structure comprising at least one oxidizable layer which will form lens and/or aperture 10. Lens and/or aperture 10 may be any of the aperture structures described above, e.g., as illustrated in FIG. 5. Lens and/or aperture 10 may utilize any combination of the described structures and methods. On top of lens and/or aperture 10 may be an optional spacer 208 and top mirror 210 comprising low-index layers 26 and high-index layers 28. If substrate 22 comprises GaAs, bottom mirror 186 may preferably comprise alternating semiconductor layers such as GaAs or AlGaAs for layers 188 and AlAs or AlGaAs for layers 200. If substrate 22 comprises InP, bottom mirror 186 may preferably comprise alternating semiconductor and oxidized layers, such as InGaAs or InP for layers 188 and an oxide for layers 200. Top mirror 210 may comprise similar materials as bottom mirror 186, or may alternatively comprise dielectric materials. To perform the oxidation process to form lens and/or aperture 10, region 216 is formed, for example by etching. Or ally, cavities 34 may be utilized. The use of cavity 34 is discussed in detail in U.S Pat. No. 5,903,589 entitled "Oxidizable Device Having Cavities which Allow for Improved Oxidation of the Semiconductor Device," filed Dec. 8, 1997. This application is hereby incorporated by reference.

After the oxidation process, lens and/or aperture 10 has non-oxidized region 218 and oxidized region 219. Since the oxidized regions of lens and/or aperture 10 have electrical resistivity typically much higher than 10 times as high as non-oxidized region 218, non-oxidized region 218 may form an electrical current aperture. Contacts 220 and 222 are deposited and preferably annealed. The exact positions of contacts 220 and 222 are determined partly by choice. When an electrical current is passed between contacts 220 and 222, the majority of the current passes through the current aperture formed by non-oxidized region 30 in lens and/or aperture 10. The current creates electrons and holes in active region 204 which recombine to emit light. Light which emits substantially perpendicular to the surfaces of mirrors 186 and 210 may be amplified to form light beam 224 emitting at an emission wavelength. When device 180 is a VCSEL and the current is above the VCSEL's current threshold, beam 224 is a laser beam. In mirror 186 or mirror 210, one period of the high- and low-index layers is nominally one half of the emission wavelength divided by the average index of the high- and low-index layers, weighted by their thicknesses.

Figure 8:
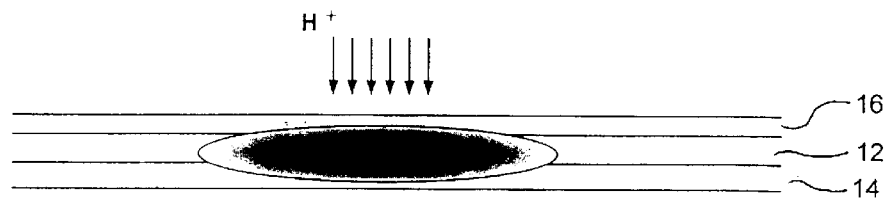
FIG. 8 is an alternate step which may be conducted in combination with the steps illustrated in FIGS. 1 through 5 to construct an oxide formed aperture.

Turning now to FIG. 8, an alternative process of hydrogen implantation is illustrated. It should be appreciated that this step may be combined with the steps illustrated in FIGS. 1 through 5 or may be used alone to assist in the oxidation process as described below.

Atomic hydrogen (H) has been shown to enhance the removal of As in the wet oxidation process in which AlAs (or AlGaAs, but hereafter referred to as AlAs) is largely replaced by $Al_2O_3$ or related aluminum oxide materials. The chemical reactions which appear to best describe the process are:

$$2AlAs + 6H_2O_{(s)} \rightarrow Al_2O_3 + As_2O_3 + 6H_2 \quad (1)$$

$$As_2O_3 + 3H_2 \rightarrow 2As_{(s)} + 3H_2O \quad (2)$$

$$2As + 6H \rightarrow 2AsH_3 \quad (3)$$

These reactions were first published by Carol I. H. Ashby, in an article entitled "Workshop on Native Oxides of Compound Semiconductors," San Antonio, Tex. (Feb. 19–20, 1997). The reaction (3) is advantageous in removing $As_{(s)}$, solid arsenic, from the material. Thereby, a more "complete" oxide is formed and the number of defects associated with residual As is reduced. Another report at this seminar suggested adding atomic H to the $H_2O$ vapor flow in a conventional oxidation process. It is expected that if the above-suggested process is conducted, there is a high chance of the H recombining to reform molecular $H_2$ before having a chance to aid in the oxidation process.

It may be advantageous to enhance oxidation of AlAs by implanting ionized H+ atoms, i.e., protons, into an AlAs layer such as layer 12. It should be appreciated that while H+ implantation has been used in other semiconductor processes, it has never been used for the specific purpose of enhancing the oxidation of $Al_xGa_{(1-x)}As$ layers where x is ~0.5 or more. Additionally, the H+ implantation may be deposited in selected regions that are defined by a photolithographic process. It is believed that by utilizing H+ implantation, the rate of oxidation may be enhanced. This should have the result of providing better definition between oxidized and nonoxidized regions. Finally, H+ implantation may result in more effective removal of As (or Sb in an Sb containing material such as AlAsSb) and therefore produce a more reliable oxide layer. An example of such a region would be region 36 of FIG. 5. This technique may be used in combination with the techniques taught in U.S. Pat. Nos.: 5,719,891 entitled "Conductive Element with Lateral Oxidation Barrier," filed Dec. 18, 1995; U.S. Pat. No. 5,881,085 entitled "Lens Comprising at Least One Oxidized Layer and Method for Forming Same," filed Jul. 25, 1996; U.S Pat. No. 5,724,374 entitled "Aperture comprising an Oxidized Region and a Semiconductor Material," filed Aug. 19, 1996; and U.S Pat. No. 5,822,356 entitled "Intra-Cavity Lens Structures for Semiconductor Lasers," filed Feb. 7, 1997.

Figure 9:
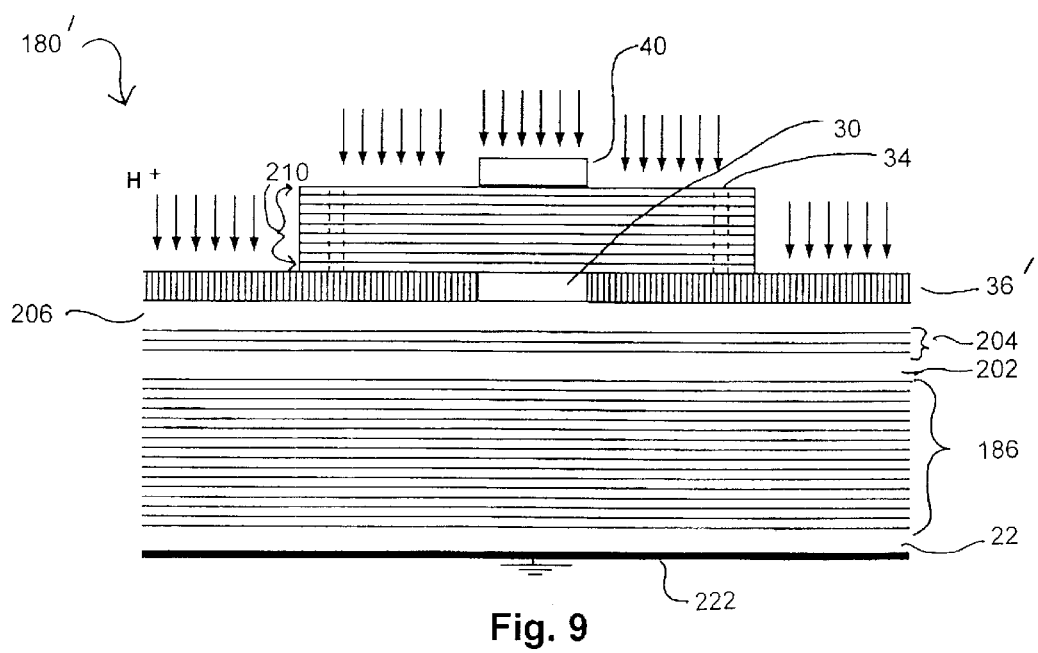
FIG. 9 is an alternate step which may be conducted in combination with the steps illustrated in FIGS. 1 through 5 to construct a vertical-cavity surface-emitting laser.

Turning now to FIG. 9, an alternate embodiment of the invention is illustrated. For clarity, like elements have been provided with like reference numeral except that a prime has been added to each reference numeral where there is a slight difference in the particular element in this embodiment. The following discussion will focus on the differences between the elements of this embodiment and that of the preferred embodiment.

As may be seen, FIG. 9 illustrates the VCSEL 180' of FIG. 7 with the inclusion of H+ implantation before the oxidation step is carried out. It should be noted that region 36' is not oxidized at the time that H+ implantation occurs. In order to provide accurate placement for the H+ implantation, a lithographic mask 40 is placed above top mirror 210. Mask 40 is positioned above intermixed region 30 and preferably has the same lateral dimension as region 30. Next, H+ is implanted by exposing the device to H+ atoms, for example, with a dosage of $1 \times 10^{14} cm^{-2}$. After the H+ implantation, the mask 40 is removed and the device is oxidized as described above. Finally, electrical contacts 220 are placed on the VCSEL.

Throughout the application, lens 10 has been referred to as a lens and/or an aperture. It should be appreciated that applicant's lens 10 will function as an aperture but not all apertures will function as a lens in applicant's invention. Additionally, blocks may be employed to stop the oxidation process in the oxidized regions of each embodiment. If this is the case, the non-oxidized region disposed between the oxidized regions may also be constructed from an oxidizable material, but are not oxidized because the blocks will prevent oxidization in these regions. Finally, it should be appreciated that in all of the embodiments illustrated the overgrown material may comprise the same material as the non-oxidized regions.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A semiconductor device comprising:
   at least a first oxidizable layer, said first oxidizable layer being modified by the addition of oxidation inhibiting elements within a laterally oriented first region forming a lateral oxidation barrier, and a second region which is oxidizable;
   a substrate disposed below said first oxidizable layer; and
   a nonoxidizable second layer disposed above said first oxidizable layer, said nonoxidizable second layer for providing said oxidation inhibiting elements to said first region, and said nonoxidizable second layer being present over at least a portion of said first region and being substantially removed over a laterally oriented third region in said second layer, wherein said nonoxidizable second and first oxidizable layers have respective dopants of the same conductivity type and an average concentration of said dopant in said nonoxidizable second layer is at least $5 \times 10^{17} cm^{-3}$ higher than average concentration of said dopant in said second region of said first oxidizable layer.

2. The semiconductor device recited in claim 1 wherein said first oxidizable layer has at least an initial Al content greater than 20%.

3. The semiconductor device recited in claim 1 wherein said oxidation inhibiting elements selected from the group consisting of: Ga, In and P.

4. The semiconductor device recited in claim 1 wherein said second layer is characterized as a first conductivity type;

said semiconductor device further comprising material of a second conductivity type residing above or below said first and second layers and thereby forming an electrical junction.

5. The semiconductor device recited in claim 4, further comprising a light emitting material situated between said first oxidizable layer and said material of a second conductive type, thereby forming a light emitting element.

6. The semiconductor device recited in claim 5, wherein said light emitting element comprises a light emitting diode.

7. The semiconductor device recited in claim 5 wherein said light emitting element comprises an edge-emitting laser diode.

8. A semiconductor device comprising:
- at least a first oxidizable layer, said first oxidizable layer being modified by the addition of oxidation inhibiting elements within a laterally oriented first region forming a lateral oxidation barrier, and a second region which is oxidizable;
- a substrate disposed below said first oxidizable layer; and
- a nonoxidizable second layer disposed above said first oxidizable layer, said nonoxidizable second layer for providing said oxidation inhibiting elements to said first region, and said nonoxidizable second layer being present over at least a portion of said first region and being substantially removed over a laterally oriented third region in said second layer, wherein said first oxidizable layer is modified, at least in said second region, by the addition of oxidation accelerating elements.

9. The semiconductor device recited in claim 8 wherein said oxidation accelerating elements are ionized H+ atoms.

10. A semiconductor device comprising:
- at least a first oxidizable layer, said first oxidizable layer being modified by the addition of oxidation inhibiting elements within a laterally oriented first region forming a lateral oxidation barrier, and a second region which is oxidizable;
- a substrate disposed below said first oxidizable layer; and
- a nonoxidizable second layer disposed above said first oxidizable layer, said nonoxidizable second layer for providing said oxidation inhibiting elements to said first region, and said nonoxidizable second layer being present over at least a portion of said first region and being substantially removed over a laterally oriented third region in said second layer; and
- at least one channel disposed through said nonoxidizable second layer and into said first oxidizable layer and in said second region of said first oxidizable layer, said channel for allowing said oxidizable layer to be oxidized.

11. The semiconductor device recited in claim 10 wherein said first and second layers have respective dopants of the same conductivity type and an average concentration of said dopant in said nonoxidizable second layer is at least $5 \times 10^{17}$ $cm^{-3}$ higher than average concentration of said dopant in said second region of said first oxidizable layer.

12. The semiconductor device recited in claim 10 wherein said first oxidizable layer is modified, at least in said second region, by the addition of oxidation accelerating elements.

13. The semiconductor device recited in claim 12 wherein said oxidation accelerating elements are ionized H+ atoms.

14. The semiconductor device recited in claim 10 wherein said second layer is characterized as a first conductivity type;
said semiconductor device further comprising material of a second conductivity type residing above or below said first and second layers and thereby forming an electrical junction.

15. The semiconductor device recited in claim 14, further comprising a light emitting material situated between said first oxidizable layer and said material of a second conductivity type, thereby forming a light emitting element.

16. The semiconductor device recited in claim 15 wherein said light emitting element comprises a light emitting diode.

17. The semiconductor device recited in claim 15 wherein said light emitting element comprises an edge-emitting laser diode.

18. The semiconductor device recited in claim 15 wherein said light emitting element further comprises:
- a substrate;
- a first mirror situated above said substrate;
- a first conductive spacer situated above said first mirror and below said light emitting material;
- a second conductive spacer situated above said light emitting material;
- a second mirror situated above said second conductive spacer;
- a first contact for electrically contacting to said conducting element, and;
- a second contact for electrically contacting to said material of a second conductive type;
- said first and second mirrors and all material between forming an optical cavity having a cavity resonance at a nominal wavelength; and
- means for injecting electrical current through said conducting element and into said light emitting material, thereby causing said light emitting device to emit a beam of light at or near said nominal wavelength;
- wherein said second region has been oxidized and said first region remains unoxidized.

* * * * *